United States Patent [19]

Stein

[11] 4,163,242

[45] Jul. 31, 1979

[54] MOS STORAGE INTEGRATED CIRCUIT USING INDIVIDUAL FET ELEMENTS

[75] Inventor: Karl-Ulrich Stein, Munich, Fed. Rep. of Germany

[73] Assignee: Siemens Aktiengesellschaft, Berlin & Munich, Fed. Rep. of Germany

[21] Appl. No.: 797,339

[22] Filed: May 16, 1977

Related U.S. Application Data

[63] Continuation of Ser. No. 414,215, Nov. 9, 1973, abandoned.

[30] Foreign Application Priority Data

Nov. 13, 1972 [DE] Fed. Rep. of Germany ....... 2255529

[51] Int. Cl.$^2$ ............................................ H01L 27/10
[52] U.S. Cl. ......................................... 357/41; 357/23; 357/24; 357/45; 357/59; 357/71; 307/238
[58] Field of Search ....................... 357/24, 23, 41, 59, 357/45; 307/238

[56] References Cited

U.S. PATENT DOCUMENTS

| | | | |
|---|---|---|---|
| 3,533,089 | 10/1970 | Wahlstrom | 357/45 |
| 3,704,384 | 11/1972 | DeSimone et al. | 357/23 |
| 3,706,891 | 12/1972 | Donofrio et al. | 357/23 |

FOREIGN PATENT DOCUMENTS

2012090 10/1970 Fed. Rep. of Germany.

OTHER PUBLICATIONS

Stein et al., *IEEE Journal of Solid-State Circuits*, vol. SC-7, No. 5, Oct. 1972, pp. 336-340.
Cohen et al., "One-transistor cell...," Electronics, Aug. 2, 1971, pp. 69-75 and front cover.
Stein et al., IEEE Journal of Solid-State Circuits, vol. SC-8, No. 5, Oct. 1973, pp. 298-323.
Langdon, "Molybdenum gates...," Electronics, Apr. 12, 1971, pp. 68-71; and IEEE Journal of Solid-State Circuits, vol. SC-6, No. 5, Oct. 1971, p. 311.

*Primary Examiner*—William D. Larkins
*Attorney, Agent, or Firm*—Hill, Van Santen, Steadman, Chiara & Simpson

[57] ABSTRACT

A MOS integrated circuit incorporating a plurality of storage cells is provided, with a field effect transistor and an individual capacitor for each cell. Electrical conductors make contact with the electrodes of the field effect transistors on two planes, with the conductors connected with the gates of the FET's being disposed in a first plane, and the conductors connected with another terminal of the FET's being disposed in a second plane.

1 Claim, 3 Drawing Figures

MOS STORAGE INTEGRATED CIRCUIT USING INDIVIDUAL FET ELEMENTS

This is a continuation of application Ser. No. 414,215, filed Nov. 9, 1973, now abandoned.

BACKGROUND

1. Field of the Invention

The present invention relates to storage elements and, more particularly, to storage elements incorporating field effect transistors produced by means of MOS techniques.

2. The Prior Art

Storage arrays incorporating multiple storage cells constructed by means of MOS techniques are well known. Some of these arrays incorporate a single transistor element for each storage cell, and one arrangement of this kind is illustrated in German patent application P 21 48 948.5, which, in FIG. 4, illustrates a plan view of a storage array incorporating an individual field effect transistor and a capacitor for each storage cell. The electrical connections with the gate electrodes of each field effect transistor are established at a location remote from the channel zone of the field effect transistor. It is desirable, if possible, to increase the packing density of the storage cells within such an array by relocating some of the electrical connections.

SUMMARY OF THE PRESENT INVENTION

It is a principal object of the present invention to provide an integrated circuit incorporating a plurality of storage cells in which the packing density of such cells is increased beyond that heretofore known.

This and other objects and advantages of the present invention will become manifest by an examination of the following description and the accompanying drawings.

In one embodiment of the present invention, there is provided a substrate supporting a plurality of field effect transistors, each having a capacitor for together forming an individual storage cell, and conductive means for providing contact with the gate electrodes of a plurality of the transistors, such conductive means being disposed in a plane spaced from the plane of the transistors and overlapping the channel zones of the transistors.

BRIEF DESCRIPTION OF THE DRAWINGS

Reference will now be made to the accompanying drawings, in which.

DESCRIPTION OF THE PREFERRED EMBODIMENT

Figure 1:
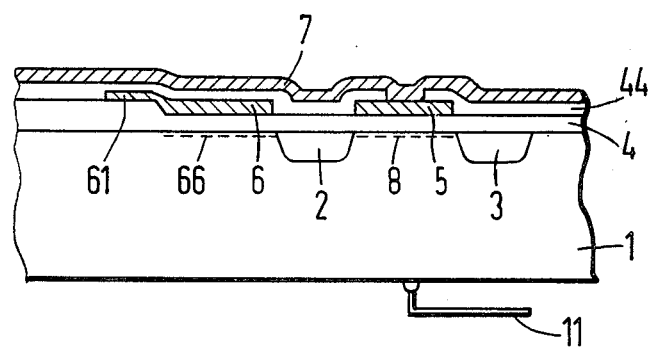
FIG. 1 is a cross-sectional illustration of an integrated circuit constructed in accordance with the present invention.

Referring to FIG. 1, a semiconductor substrate 1 is provided which, in one example, is n-conducting silicon. The substrate 1 contains diffusion zones 2 and 3, which are doped with p-conductive material. The diffusion zone 3 represents the source zone of a field effect transistor (or FET), and the zone 2 represents the drain zone of the FET. The zone 8 between the zones 2 and 3 is referred to as the "channel zone" of the FET.

Instead of employing n-conductive material for the substrate 1, it is possible to use a substrate with a layer of n-conductive semi-conductive material arranged thereon, for example, by epitaxially growing the n-conductive layer. Alternatively, either a p-conductive substrate 1 may be employed, in which case the zones 2 and 3 are doped with n-conductive material, or a p-conductive layer may be provided on another substrate, as is well known in the art. The present invention does not require the use of a substrate of any particular construction or conductivity.

On top of the surface of the substrate 1, and also on top of the zones 2 and 3, a layer 4 of electrically insulating material is applied. The layer 4 is preferably silicon dioxide. On top of the layer 4, opposite a location adjacent the zone 2, an electrically conductive coating 6 is applied, which forms a first conductive path. The coating 6 forms one electrode of a capacitor which is electrically connected to the zone 2 of the FET. The second electrode of this capacitor is the inversion layer 66, which forms beneath the electrode 6 in the semiconductor substrate 1 when voltage is applied between the coating 6 and the substrate 1. A conductor 61 is provided in electrical contact with the coating 6, and a conductor 11 is electrically connected to the substrate 1. A suitable voltage may then be applied between the conductors 61 and 11. The electrically insulating layer 4 acts as the dielectric of the capacitor.

An electrically conductive coating 5 is applied to the layer 4 above the channel zone 8, between the zones 2 and 3, and the coating 5 represents the gate electrode of the FET. Both the coatings 5 and 6 are preferably formed of a conductive material which is resistant to temperatures exceeding 1,000° C. Such conductive material may be, for example, polycrystalline doped silicon, which possesses the advantage that it remains stable at temperatures exceeding 1,000° C. Alternatively, the coatings 5 and 6 may be formed of molybdenum, which is also stable at high temperatures.

Figure 2:
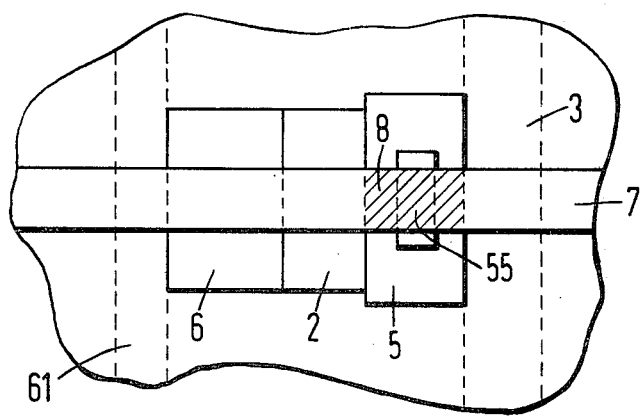
FIG. 2 is a plan view of the circuit of FIG. 1.

Applied to the upper surface of the layer 4, and to the upper surface of the coatings 5 and 6, an electrically insulating layer 44 is provided. The layer 44, like the layer 4, is preferably formed of silicon dioxide. A recess is formed in a portion of the layer 44 adjacent a portion of the upper surface of the coating 5, so that after application of the layer 44, the upper surface of the layer 5 remains exposed. A conductor path 7 is applied to the surface of the layer 44, and electrically contacts the coating 5 through the recess in the area 55 (FIG. 2). In this way, there is a direct connection between the gate electrode 5 of the FET and the conductor path 7, which runs above this electrode and also above the coating 6 and the electrode 61.

The conductor 7 is preferably formed of a metallic conductive material, such as aluminum.

In FIG. 2, a plan view of the apparatus of FIG. 1 is illustrated. The conductor 61 is illustrated as running vertically, while the conductor 7 is illustrated as running horizontally. The conductor 61 is exposed at an edge or terminal portion of the substrate 1, where it can be externally connected. The conductor 7 is exposed on top of the assembly, so that its external connection is made without difficulty.

As illustrated in FIG. 2, the zone 3 is formed as a channel which runs in a vertical direction. This channel may be externally connected at the marginal portions of the substrate 1. The electrical connection between the conductor 7 and the coating 5 lies opposite the channel zone 8 of the transistor.

Figure 3:
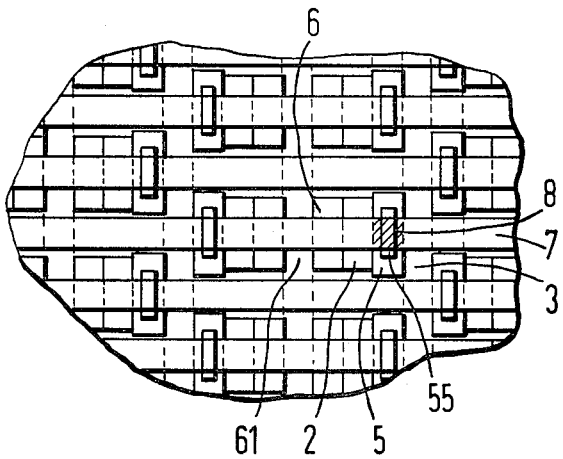
FIG. 3 is a plan view of a portion of a storage arrangement incorporating a plurality of circuits like those of FIGS. 1 and 2.

FIG. 3 shows a plan view of an array including a plurality of the storage elements of FIG. 2. The entire array is supported on a single substrate. The reference numerals in FIG. 3 relate to corresponding portions of the apparatus which have been described in connection with FIGS. 1 and 2. It is apparent that the arrangement illustrated in FIG. 3 consists of a plurality of cells, each of which has an individual field effect transistor and a series-connected capacitor. The source electrodes of the individual field effect transistors are connected to one another by means of the common diffusion channels 3, and the drain electrodes are interconnected by means of the conductors 61. Similarly, the gates of the FET's are interconnected by the horizontal conductors 7. In one arrangement, the several different diffusion channels 3 may be connected with individual digit selecting lines, while the conductor 7 may be connected with individual word selecting lines, to permit independent access to any individual storage cell within the assembly by simultaneously externally connecting the electrodes for such cell. In the arrangement of FIG. 3, the contact points between the conductor 7 and the gate electrodes of the FET's lie at least partially above the channel zones 8 of the FET's, and thus provide a greater packing density of the individual elements within a given area. The portions of the conductors 7 which overlie the channel zones 8 are indicated by shading 55 in FIGS. 2 and 3.

In the arrangement illustrated in FIG. 3, no connections between the conductor 7 and the individual FET's outside the channel zones 8 of the individual FET's are required. The areas required in prior art arrangements for such connections can therefore be used to support additional FET's and capacitors, in order to produce a substantial increase in the packing density of the storage cells on a given surface area of substrate.

It will be appreciated by others skilled in the art that various modifications and additions can be made in the structure illustrated and described above, without departing from the essential features of novelty thereof, which are intended to be defined and secured by the appended claims.

What is claimed is:

1. An integrated circuit comprising a semiconductor substrate and a plurality of one-transistor storage cells supported on said substrate, each of said storage cells having an individual field effect transistor and a capacitor connected in series therewith, said field effect transistors being formed in a single plane by a plurality of spaced pairs of diffusion zones in a surface of said substrate, said substrate forming a channel zone between each of said pairs of diffusion zones, a first diffusion zone of each of said pairs being formed as a common diffusion zone shared with a plurality of said field effect transistors, said integrated circuit including a first electrically insulating layer superposed on said surface of said substrate, a first electrically conducting coating superposed on said insulating layer between the two diffusion zones of each pair of said zones to form a gate electrode of a field effect transistor, a second electrically conductive coating superposed on said insulating layer to form an electrode of a capacitor connected in series with each field effect transistor, said first and second conductive coatings being disposed in a single conductor plane, a second insulating layer superposed on said first and second conducting layers and having a plurality of recesses aligned with a portion of each gate electrode, whereby each of said recesses is disposed at least partially above a channel zone of a transistor of a one-transistor storage cell, and a third electrically conductive layer in the form of a strip superposed on said second insulating layer for establishing electrical contact through said recesses, with the gate electrodes of a plurality of field effect transistors located partially under said strip, said first diffusion zones being disposed in said substrate in a plurality of elongate, spaced apart parallel zones each defining a column of said transistors, said strips being disposed in a plurality of elongate, spaced apart parallel strips transverse to said first diffusion zones each defining a row of said transistors, the transistors in each said row being arranged in back-to-back relationship in pairs, with the transistors of each pair being located between and connected to adjacent ones of said first diffusion zones, and being separated in a direction transverse to said rows, by adjacent ones of said strips from others of said pairs.

* * * * *